United States Patent
Inadomi

(10) Patent No.: US 9,449,857 B2
(45) Date of Patent: Sep. 20, 2016

(54) SUBSTRATE PROCESSING APPARATUS AND SUBSTRATE PROCESSING METHOD

(71) Applicant: Tokyo Electron Limited, Tokyo (JP)

(72) Inventor: Hiroaki Inadomi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 734 days.

(21) Appl. No.: 13/906,546

(22) Filed: May 31, 2013

(65) Prior Publication Data

US 2013/0327363 A1 Dec. 12, 2013

(30) Foreign Application Priority Data

Jun. 8, 2012 (JP) .................................. 2012-131026

(51) Int. Cl.
*H01L 21/67* (2006.01)
*H01L 21/02* (2006.01)

(52) U.S. Cl.
CPC ... *H01L 21/67034* (2013.01); *H01L 21/67028* (2013.01); *H01L 21/67173* (2013.01); *H01L 21/67178* (2013.01); *H01L 21/67184* (2013.01); *H01L 21/02057* (2013.01)

(58) Field of Classification Search
None
See application file for complete search history.

(56) References Cited

FOREIGN PATENT DOCUMENTS

| JP | 2002-329650 A | 11/2002 |
|----|---------------|---------|
| JP | 2003-045770 A | 2/2003 |
| JP | 2003-297901 A | 10/2003 |

*Primary Examiner* — Michael Kornakov
*Assistant Examiner* — Ryan Coleman
(74) *Attorney, Agent, or Firm* — Abelman, Frayne & Schwab

(57) ABSTRACT

A substrate processing apparatus is provided including: a liquid processing unit that processes a substrate with a processing liquid; a carry-in port formed in the liquid processing unit and configured to carry-in the substrate in a dry-state before the substrate is processed with the processing liquid; a carry-out port formed in the liquid processing unit and configured to carry-out the substrate in a wet-state after completing the liquid processing; a supercritical dry processing unit that performs a dry processing for the substrate using a supercritical fluid; a first substrate transport unit that transports the substrate in a dry-state before the substrate is processed with the processing liquid to the carry-out port of the liquid processing unit; and a second substrate transport unit that transports the substrate in a wet-state after completing the liquid processing from the carry-out port of the liquid processing unit to the supercritical dry processing unit.

10 Claims, 5 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2012-131026, filed on Jun. 8, 2012, with the Japan Patent Office, the disclosure of which is incorporated herein in its entirety by reference.

TECHNICAL FIELD

The present disclosure relates to a substrate processing apparatus and a substrate processing method, and particularly, to a substrate processing apparatus and a substrate processing method in which a substrate is processed with a processing liquid using a liquid processing unit, and then, the substrate is subjected to a dry processing with a supercritical fluid using a supercritical dry processing unit.

BACKGROUND

In the related art, when semiconductor components or flat panel displays are manufactured, a substrate processing apparatus is used to perform a liquid processing such as, for example, a cleaning process or an etching process for a substrate such as, for example, a semiconductor wafer and a liquid crystal substrate, with various kinds of processing liquids, and then, to perform a dry processing that removes the processing liquids remaining on the substrate.

In the substrate processing apparatus, a phenomenon called a substrate surface pattern collapse occurs in which the pattern of the substrate surface collapses by the action of the surface tension of the processing liquid remaining on the substrate during the dry processing. The pattern collapse occurs as the aspect ratio becomes higher according to the miniaturization of the pattern of a substrate surface such as, for example, an etching mask pattern and a circuit pattern formed on the substrate surface.

In the conventional substrate processing apparatus, a substrate is processed with a processing liquid using a liquid processing unit, and thereafter, the substrate is subjected to a dry processing in which the processing liquid remaining on the surface is substituted with a fluid of supercritical state (a supercritical fluid) and then is evaporated using a supercritical dry processing unit.

In the substrate processing apparatus that performs the supercritical dry processing, a substrate transport unit is provided to transport a substrate to the liquid processing unit or the supercritical dry processing unit.

The substrate processing apparatus carries a substrate in a dry-state before the liquid processing into the liquid processing unit through an opening of the liquid processing unit using the substrate transport unit. In the liquid processing unit, the surface of the substrate is subjected to a liquid processing, and then, coated with an anti-dry liquid (e.g., an organic solvent such as isopropyl alcohol) to make the surface of the substrate in a wet-state. Thereafter, the substrate in a wet-state after the liquid processing is carried out from the same opening of the liquid processing unit to be transported to the supercritical dry processing unit using the substrate transport unit which is used at the time when the substrate is carried into the liquid processing unit. In the supercritical dry processing unit, the anti-dry liquid coated on the surface of the substrate is substituted with carbon dioxide of supercritical state, and then the carbon dioxide is discharged, thereby drying the surface of the substrate. Thereafter, the substrate in a dry-state after the dry processing is carried out from the supercritical dry processing unit using the same substrate transport unit.

As described above, in the conventional substrate processing apparatus, a substrate in a dry-state before the liquid processing or a substrate in a wet-state after the liquid processing (before the dry processing) is carried into/out through the same opening using the same substrate transport unit. See, for example, Japanese Patent Laid-Open Publication No. 2002-329650.

SUMMARY

According to an aspect of the present disclosure, there is provided a substrate processing apparatus including: a liquid processing unit configured to process a substrate with a processing liquid; a carry-in port formed in the liquid processing unit and configured to carry in a substrate in a dry-state before the substrate is processed with the processing liquid; a carry-out port formed in the liquid processing unit and configured to carry out a substrate in a wet-state after the substrate is processed with the processing liquid; a supercritical processing unit configured to perform a dry processing for the substrate using a supercritical fluid; a first substrate transport unit configured to carry in the substrate in a dry-state before the substrate is processed with the processing liquid to the carry-in port of the liquid processing unit; and a second substrate transport unit configured to carry out the substrate in a wet-state after the substrate is processed with the processing liquid from the carry-out port of the liquid processing unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
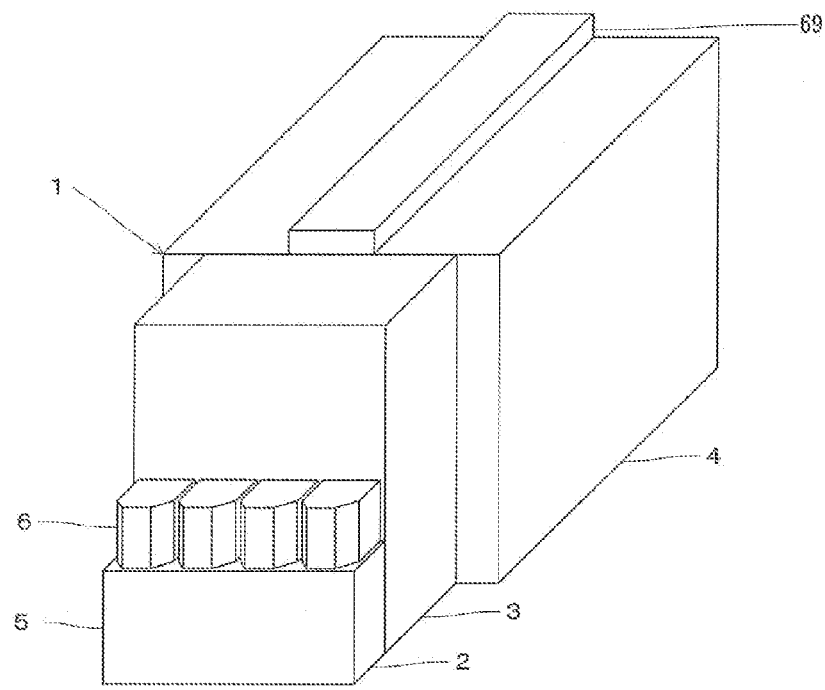
FIG. 1 is a perspective view illustrating a substrate processing apparatus.
Figure 2:
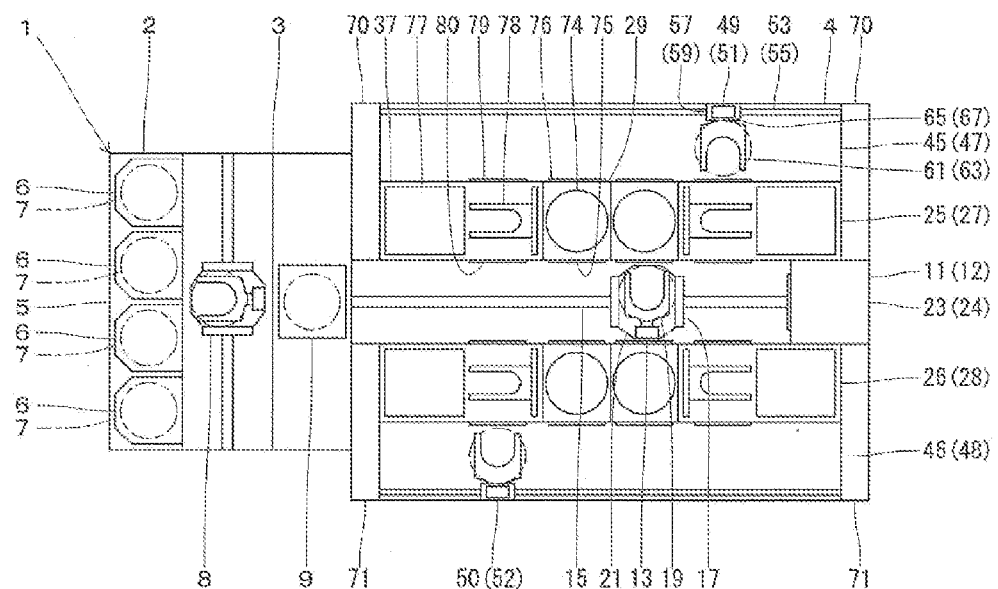
FIG. 2 is a plan view of the liquid processing apparatus.
Figure 3:
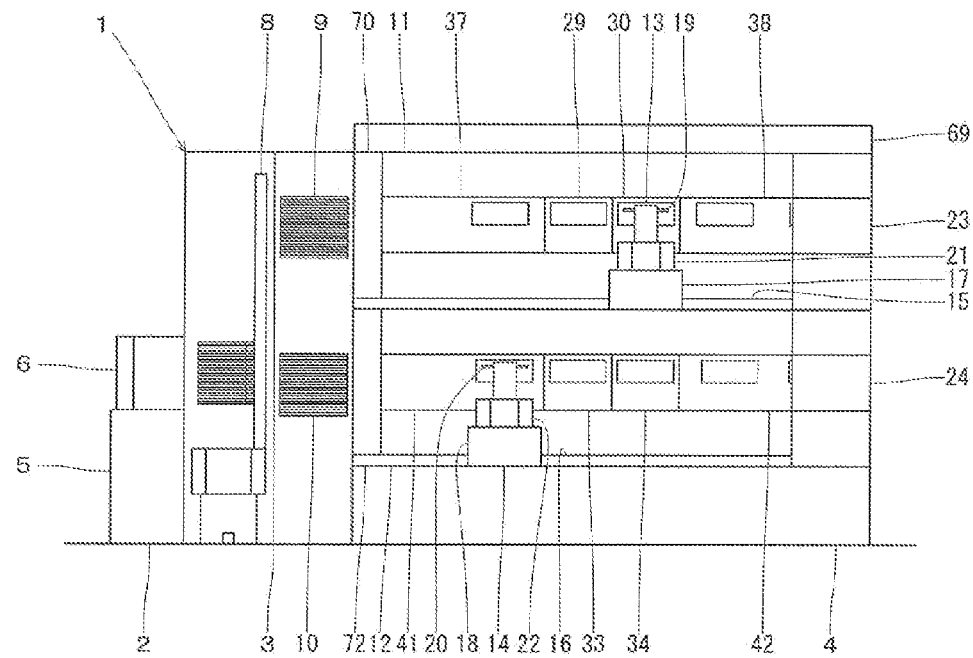
FIG. 3 is a plan view seen from the right side of the liquid processing apparatus.
Figure 4:
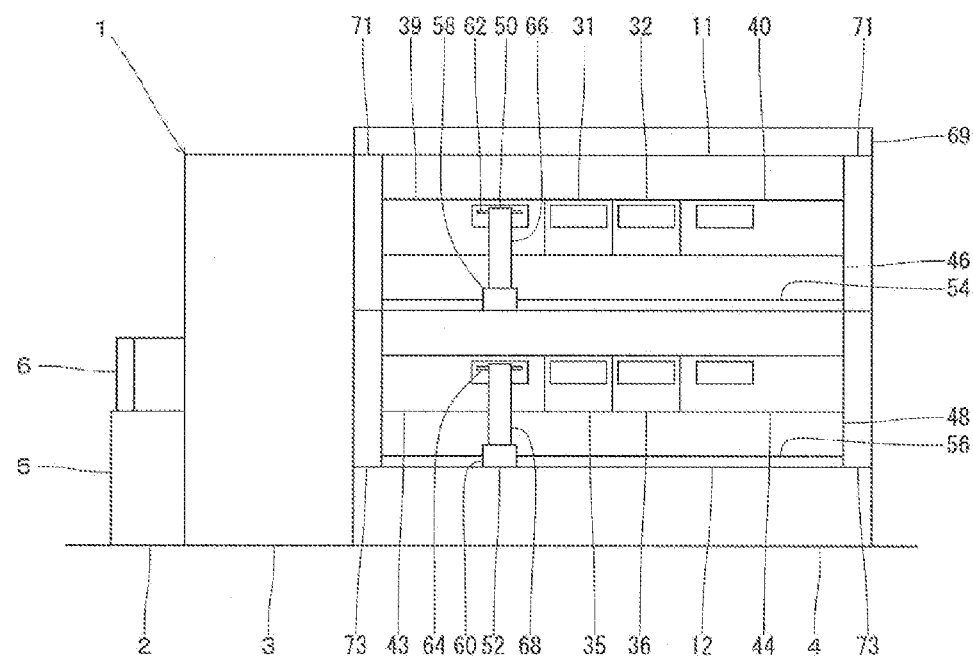
FIG. 4 is a plan view seen from the right side of the liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the conventional substrate processing apparatus, since the substrate in a dry-state before the liquid processing and the substrate in a wet-state after the liquid processing are transported through the same opening using the substrate transport unit, the transport path where the substrate in a dry-state is transported and the transport path where the substrate in a wet-state is transported are overlapped in the opening of the liquid processing unit.

As a result, in the conventional substrate processing apparatus, there is a concern that the processing liquid scattered or volatilized in the opening of the liquid processing unit may be transferred and attached on the substrate after completing the dry processing through the substrate transport unit, and thus, the surface of the substrate after completing the dry processing may be contaminated to decrease the yield of the substrate processing apparatus.

Specifically, since the substrate in a wet-state after completing the liquid processing (before the dry processing) is coated with an organic solvent such as, for example, isopropyl alcohol having high volatility, there is a concern that an area such as, for example, the transport path of the substrate, the substrate transport unit, the substrate before the liquid processing and the substrate after the liquid processing may be widely contaminated by the volatilization of the organic solvent.

According to an aspect of the present disclosure, there is provided a substrate processing apparatus including: a liquid processing unit configured to process a substrate with a processing liquid; a carry-in port formed in the liquid processing unit and configured to carry in a substrate in a dry-state before the substrate is processed with the processing liquid; a carry-out port formed in the liquid processing unit and configured to carry out a substrate in a wet-state after the substrate is processed with the processing liquid; a supercritical processing unit configured to perform a dry processing for the substrate using a supercritical fluid; a first substrate transport unit configured to carry in the substrate in a dry-state before the substrate is processed with the processing liquid to the carry-in port of the liquid processing unit; and a second substrate transport unit configured to carry out the substrate in a wet-state after the substrate is processed with the processing liquid from the carry-out port of the liquid processing unit.

The second substrate transport unit may transport the substrate in a state where the substrate is wetted by an organic solvent.

The substrate processing apparatus may further include a first substrate transport chamber configured to accommodate the first substrate transport unit and a second substrate transport chamber configured to accommodate the second substrate transport unit.

The carry-in port and the first substrate transport chamber may be communicated with each other, and the carry-out port and the second substrate transport chamber may be communicated with each other.

A door capable of being opened/closed may be installed in the carry-in port and/or the carry-out port.

The dew point temperature of the gas supplied to the second substrate transport chamber may be lower than the dew point temperature of the gas supplied to the first substrate transport chamber.

The substrate in a dry-state subjected to the dry processing in the supercritical dry processing unit may be carried out from the supercritical dry processing unit by the first substrate transport unit.

The first substrate transport unit and the second substrate transport unit may be disposed in the opposite sides while the liquid processing unit is interposed therebetween.

The second substrate transport unit may be disposed between the liquid processing unit and the supercritical dry processing unit.

The liquid processing unit may be adjacent to the supercritical dry processing unit through the carry-out port of the liquid processing unit, and the second substrate transport unit may be accommodated within the supercritical dry processing unit.

Further, according to another aspect of the present disclosure, there is provided a substrate processing method including: transporting a substrate in a dry-state before the substrate is going through a liquid processing to a carry-in port formed in a liquid processing unit using a first substrate transport unit; processing the substrate in a dry-state with a processing liquid using the liquid processing unit; transporting the substrate in a wet-state after completing the liquid-processing from a carry-out port, which is formed separately from the carry-in port, formed in the liquid processing unit to a supercritical dry processing unit using a second substrate transport unit; and processing the substrate in a wet-state with a supercritical fluid using the supercritical dry processing unit.

The substrate processing method may further include transporting the substrate in a state where the substrate is wetted by an organic solvent using the second substrate transport unit.

The substrate processing method may further include supplying gas having dew point temperature to the second substrate transport, the dew point temperature being lower than gas supplied to the first substrate transport unit.

The substrate processing method may further include carrying out the substrate in a dry-state subjected to the dry processing in the supercritical dry processing unit from the supercritical dry processing unit using the first substrate transport unit.

According to the present disclosure, the processing liquid may be prevented from being transferred and attached to the substrate after the dry processing, the contamination of the surface of the substrate may be prevented, and thus, the yield of the substrate processing apparatus may be improved.

Hereinafter, specific configurations of a substrate processing apparatus according to the present disclosure and a substrate processing method used in the substrate processing apparatus will be described with reference to accompanying drawings.

Referring to FIGS. 1 to 4, a substrate processing apparatus 1 includes a carry-in/carry-out part 2 formed in the front end portion thereof, a transport part 3 formed in the rear side of carry-in/carry-out part 2, and a processing part 4 formed in the rear side of transport part 3.

Carry-in/carry-out part 2 is configured to dispose a plurality of carriers 6 (e.g., four in the present embodiment) side by side on a substrate carrying-in/carrying-out table 5. Each of carriers 6 accommodates a plurality of substrates 7 (e.g., 25 semiconductor wafers in the present embodiment).

Transport part 3 accommodates a substrate transport device 8 in the front side thereof, and substrate transferring tables 9, 10 in a vertical direction in the rear side thereof.

In processing part 4, first substrate transport chambers 11, 12 are disposed in a vertical direction. First substrate transport chambers 11, 12 extend in a forward and rearward direction in the center portion of processing part 4. First substrate transport chambers 11, 12 are communicated with substrate transferring tables 9, 10 of transport part 3 at their front sides, respectively. A first substrate transport device constituting each of first substrate transport units 13, 14 is accommodated within each of first substrate transport chambers 11, 12. In first substrate transport units 13, 14, substrate holders 19, 20 each holding a single substrate 7 horizontally are attached to transport tables 17, 18 which are capable of being moved along rails 15, 16 that extend in a forward and rearward direction through moving bodies 21, 22. Substrate holders 19, 20 are configured to be capable of being elevated, rotated, advanced and retreated, respectively. Further, substrate cooling units 23, 24 each cooling heated substrate 7 are disposed in the rear end portion of first substrate transport chambers 11, 12, respectively.

Further, in processing unit 4, substrate processing chambers 25, 26, 27, 28 that extend in a forward and rearward direction are disposed in the side by side of substrate transport chambers 11, 12, respectively. In the inside of substrate processing chambers 25, 26, 27, 28, liquid processing units 29, 30, 31, 32, 33, 34, 35, 36 that liquid-process substrate 7 with a processing liquid are disposed in a forward and rearward direction in the middle portion of each of substrate processing chambers 25, 26, 27, 28. Supercritical dry processing units 37, 38, 39, 40, 41, 42, 43, 44 that perform a dry processing for substrate 7 with a supercritical fluid are disposed in the front/rear end portions of substrate processing chambers 25, 26, 27, 28, respectively.

Further, second substrate transport chambers 45, 46, 47, 48 that extend in a forward and rearward direction are disposed in the left and right end portions of processing part 4 (outside of substrate processing chambers 25, 26, 27, 28), respectively. A second substrate transport device constituting each of second substrate transport units 49, 50, 51, 52 is accommodated within each of second substrate transport chambers 45, 46, 47, 48. In second substrate transport units 49, 50, 51, 52, substrate holders 61, 62, 63, 64 each holding a single substrate 7 horizontally are attached to transport tables 57, 58, 59, 60 which are capable of being moved along rails 53, 54, 55, 56 that extend in a forward and rearward direction through moving bodies 61, 62, 63, 64, respectively. The substrate holders 61, 62, 63, 64 are configured to be advanced and retreated. Further, second substrate transport units 49, 50, 51, 52 are configured to transport substrate 7 in a state where the top surface of substrate 7 is coated with an anti-dry liquid.

Further, in processing part 4, an air-blower mechanism 69 is disposed above first substrate transport chamber 11, and the air is blown from the top side to the bottom side within first substrate transport chambers 11, 12 using air-blower mechanism 69. Further, in processing part 4, air-blower mechanisms 70, 71, 72, 73 are disposed in the front/rear end portions of substrate processing chambers 25, 26, 27, 28 and second substrate transport chambers 45, 46, 47, 48. The dry air of which the dew point temperature is −20° C. or less and preferably is −40° C. or less is blown from the upside of the rear side to the downside of the front side within each of substrate processing chambers 25, 26, 27, 28 and each of second substrate transport chambers 45, 46, 47, 48 using air-blower mechanisms 70, 71, 72, 73, respectively. As described above, in processing part 4, the dew point temperature of the gas (dry air in the present embodiment) supplied to second substrate transport chambers 45, 46, 47, 48 is made to be lower than the dew point temperature of the gas (air in the present embodiment) supplied to first substrate transport chambers 11, 12.

Figure 5:
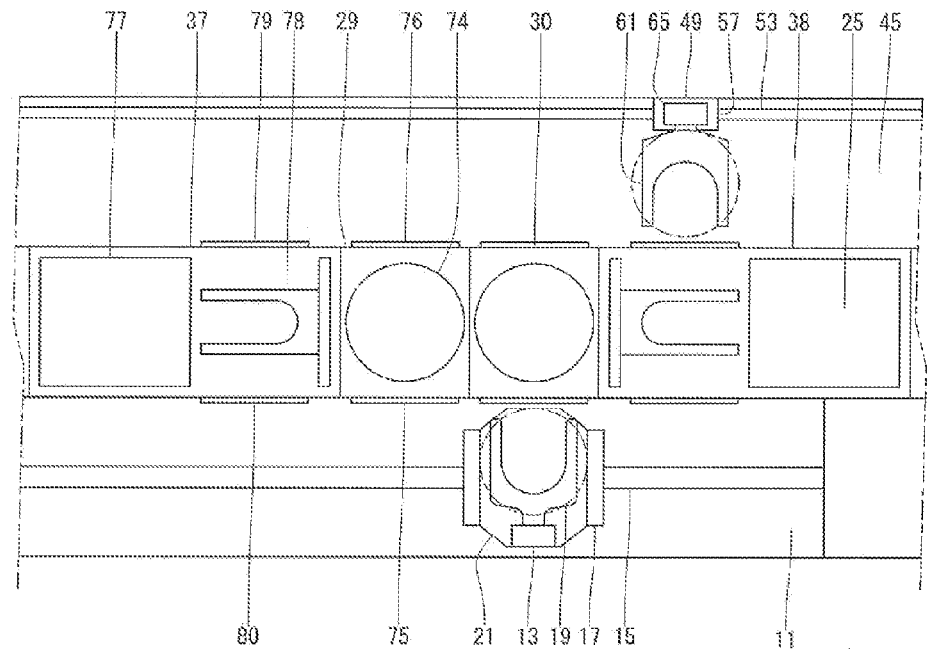
FIG. 5 is an enlarged plan view of the liquid processing apparatus.
Figure 6:
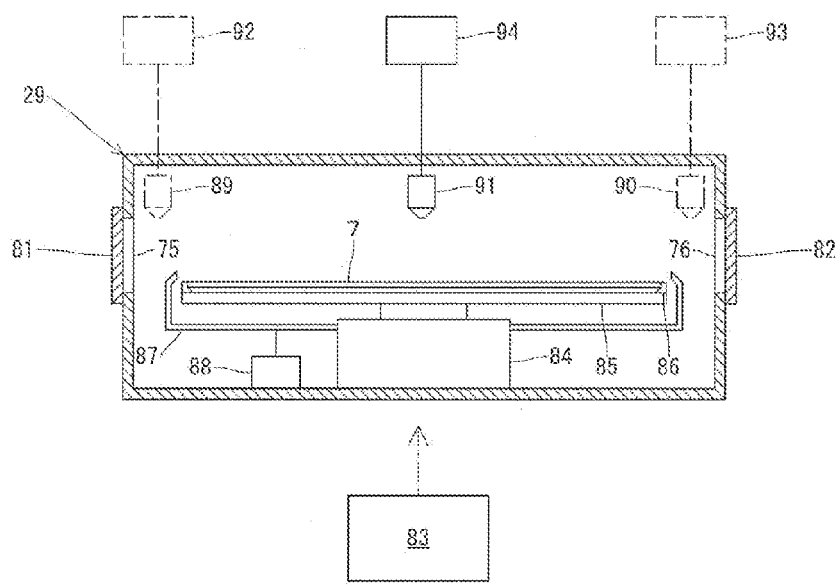
FIG. 6 is a schematic cross-sectional view of a liquid processing unit.

As illustrated in FIGS. 5 and 6, each of liquid processing units 29, 30, 31, 32, 33, 34, 35, 36 accommodates a liquid processing device 74 that liquid-processes substrate 7 therein, and a carry-in port 75 that is communicated with each of first substrate transport chambers 11, 12 and a carry-out port 76 that is communicated with each of second substrate transport chambers 45, 46, 47, 48 are formed in opposite positions interposing liquid processing device 74 therebetween. Substrate 7 in a dry-state before the liquid processing is carried into liquid processing device 74 through carry-in port 75 using each of first substrate transports unit 13, 14, and substrate 7 in a wet-state after the liquid processing is carried out from liquid processing device 74 through carry-out port 76 using each of second substrate transport units 49, 50, 51, 52. Doors 81, 82 are installed to be opened/closed in carry-in port 75 and carry-out port 76, respectively. Doors 81, 82 are opened/closed by a control unit 83. Further, control unit 83 controls the entire substrate processing apparatus 1.

In liquid processing device 74, a turn table 85 is attached on a rotating mechanism 84, and holders 86 are attached on the peripheral portion of turn table 85 in a circumference direction with an interval. Accordingly, liquid processing device 74 horizontally rotates substrate 7 held by holders 86 using rotating mechanism 84. Further, in liquid processing device 74, a cup 87 is disposed outside of the peripheral of turn table 85 (substrate 7), and an elevating mechanism 88 is connected to cup 87. Accordingly, liquid processing device 74 moves down cup 87 at the time of carrying-in/carrying-out substrate 7, moves up cup 87 at the time of the liquid processing of substrate 7, thereby recovering the processing liquid. Further, in liquid processing device 74, a cleaning nozzle 89, a rinsing nozzle 90 and an anti-dry processing nozzle 91 are disposed above turn table 85 (substrate 7) in a state where the nozzles are capable of being moved separately. A cleaning liquid supply mechanism 92 that supplies a cleaning liquid such as, for example, an aqueous solution of hydrogen fluoride is connected to cleaning nozzle 89. A rinse liquid supply mechanism 93 that supplies a rinse liquid such as, for example, a deionized water is connected to rinsing nozzle 90. An anti-dry liquid supply mechanism 94 that supplies an anti-dry liquid (an organic solvent such as, for example, isopropyl alcohol, hydrofluoroether, and acetone) is connected to anti-dry processing nozzle 91.

Figure 7:
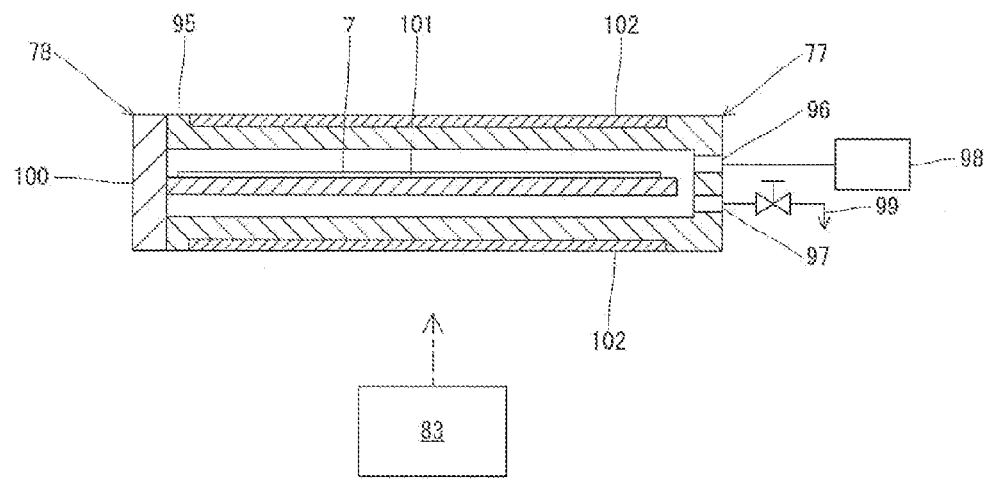
FIG. 7 is a schematic cross-sectional view of a dry processing unit.

Further, as illustrated in FIGS. 5 and 7, each of supercritical dry processing units 37, 38, 39, 40, 41, 42, 43, 44 accommodates dry processing device 77 that supercritical dry-processes substrate 7 therein, and carry-in/carry-out mechanism 78 that carries-in/carries-out substrate 7 to/from dry processing device 77 is installed to be capable of being advanced and retreated. A carry-in port 79 that is communicated with each of second substrate transport chambers 45, 46, 47, 48 and a carry-out port 80 that is communicated with each of first substrate transport chambers 11, 12) are formed in opposite positions interposing carry-in/out mechanism 78 therebetween. Substrate 7 in a wet-state after completing the liquid processing is carried into carry-in/carry-out mechanism 78 through carry-in port 79 using second substrate transport units 49, 50, 51, 52. Substrate 7 in a dry-state after completing the dry processing is carried out from carry-in/carry-out mechanism 78 through carry-out port 80 using first substrate transport units 13, 14. Doors are installed to be capable of being opened/closed in carry-in port 79 and carry-out port 80, respectively.

In dry processing device 77, a suction port 96 and a discharging port 97 are formed in a hollow portion of a chamber body 95 in a rectangular box shape of which the front end is opened. A processing fluid supply mechanism 98 that supplies a supercritical fluid (a substrate processing fluid) such as, for example, carbon dioxide is connected to suction port 96, and a discharging mechanism 99 including, for example, an opening/closing valve is connected to discharging port 97. Further, in dry processing device 77, a cover 100 and a substrate disposing table 101 that also serve as carry-in/carry-out mechanism 78 are attached to the front end of chamber body 95 to be capable of being opened/closed. Further, in dry processing device 77, heaters 102 that heat the inside of chamber body 95 are attached to the top and bottom surfaces of chamber body 95, respectively.

Substrate processing apparatus 1 is configured as described above. In substrate processing apparatus 1, substrate 7 before the processing is carried into carry-in/carry-out part 2 in a state where substrate 7 is accommodated in carrier 6, and substrate 7 is transported to the upper or lower substrate transferring table 9 or 10 from any one of carriers 6 using substrate transport device 8 of transport part 3. Substrate 7 is then processed in processing part 4.

In processing part 4, substrate 7 is carried into any one of liquid processing units 29 to 36 from any one of substrate transferring tables 9, 10 one by one using one of first substrate transport units 13, 14.

In any one of liquid processing units 29 to 36, substrate 7 in a dry-state before the liquid processing is carried into liquid processing device 74 from carry-in port 75 using one of first substrate transport units 13, 14 in a state where carry-in port 75 is opened and carry-out port 76 is closed. Then, in any one of liquid processing units 29 to 36, a cleaning liquid is supplied toward the surface of substrate 7 from cleaning nozzle 89 to clean substrate 7, and thereafter, a rinse liquid is supplied from rinsing nozzle 90 to rinse substrate 7 in a state where carry-in port 75 is closed and substrate is rotated by liquid processing device 74. Then, in any one of liquid processing units 29 to 36, an anti-dry liquid is supplied toward the surface of substrate 7 from anti-dry processing nozzle 91 using liquid processing device 74 to coat the surface of substrate 7 with the anti-dry liquid, thereby wetting substrate 7. Accordingly, the anti-dry processing of substrate 7 is performed. Then, in any one of liquid processing units 29 to 36, carry-out port 76 is opened in a state where carry-in port 75 is closed, and substrate 7 in a wet-state after completing the liquid processing is carried out through carry-out port 76 using one of second substrate transport units 49 to 52. Then, in one of liquid processing units 29 to 36, carry-out port 76 is closed.

Then, substrate 7 is carried into any one of supercritical dry processing units 37 to 44 using any one of second substrate transport units 49 to 52. At that time, substrate 7 is in a state where the top surface of substrate 7 is coated with the anti-dry liquid.

In any one of supercritical dry processing units 37 to 44, substrate 7 in a wet-state after completing the liquid processing is carried into substrate disposing table 101 of carry-in/carry-out mechanism 78 from carry-in port 79 using any one of second substrate transport units 49 to 52 in a state where carry-in port 79 is opened and carry-out port 80 is closed. Then, in any one of supercritical dry processing units 37 to 44, carry-in port 79 is closed, substrate 7 is accommodated within chamber body 95 of dry processing device 77 using carry-in/carry-out mechanism 78, and chamber body 95 is sealed by cover 100. Then, in any one of supercritical dry processing units 37 to 44, the substrate processing fluid in a supercritical state is supplied from processing fluid supply mechanism 98 to the inside of chamber body 95, and the anti-dry fluid on the surface of substrate 7 is substituted with the substrate processing fluid in the supercritical state. Then, in any one of supercritical dry processing units 37 to 44, the substrate processing fluid in the supercritical state is discharged from the inside of chamber body 95 by discharging mechanism 99 to depressurize the inside of chamber body 95. Accordingly, the supercritical dry processing of substrate 7 is performed. Thereafter, in any one of supercritical dry processing units 37 to 44, substrate 7 is carried-out to the outside of chamber body 95 by using carry-in/carry-out mechanism 78. Then, in any one of supercritical dry processing units 37 to 44, carry-out port 80 is opened in a state where carry-in port 79 is closed, and substrate 7 in a dry-state after completing the dry processing is carried out through carry-out port 80 using any one of first substrate transport units 13, 14. Then, in any one of supercritical dry processing units 37 to 44, carry-out port 80 is closed.

Here, in each of supercritical dry processing units 37 to 44, while the dry processing of substrate 7 is performed by substituting the anti-dry liquid on the surface of substrate 7 with the substrate processing fluid in the supercritical state and depressurizing, the present disclosure is not limited thereto. The anti-dry liquid itself that covers the surface of substrate 7 may be changed into a supercritical fluid by supplying high pressurized substrate processing fluid to the inside of chamber body 95, and then, the inside of chamber body 95 may be depressurized to perform the dry processing of substrate 7. That is, in any one of supercritical dry processing units 37 to 44, substrate 7 is accommodated within chamber body 95 of dry processing device 77 using carry-in/carry-out mechanism 78, chamber body 95 is sealed by cover 100, and then, a substrate processing fluid with a high pressure is supplied from processing fluid supply mechanism 98 to the inside of chamber body 95 to change the anti-dry fluid on the surface of substrate 7 into a supercritical fluid caused by the action of the substrate processing fluid with a high pressure. Then, in any one of supercritical dry processing units 37 to 44, the anti-dry fluid and the substrate processing fluid are discharged from the inside of chamber body 95 using discharging mechanism 99 to depressurize the inside of chamber body 95. As a result, the supercritical dry processing of substrate 7 may also be performed. Further, the substrate processing fluid or the anti-dry fluid is not limited to a case where the fluid is supercritical state, but the fluid may be a subcritical state which is similar to the supercritical state.

Then, substrate 7 is transported from one of supercritical dry processing units 37 to 44 to substrate cooling units 23, 24 using one of first substrate transport units 13, 14 to cool substrate 7, and then, substrate 7 is transported to one of substrate transferring tables 9, 10.

Substrate 7 processed in processing part 4 is transported to any one of carriers 6 from one of substrate transferring tables 9, 10 using substrate transport device 8 of transport part 3.

As described above, in substrate processing apparatus 1, substrate 7 is liquid-processed with the processing liquid using liquid processing units 29 to 36, and then, substrate 7 is dry-processed with the supercritical fluid by using supercritical dry processing units 37 to 44. At that time, in substrate processing apparatus 1, substrate 7 in a dry-state before the liquid processing is transported to carry-in port 75 formed in liquid processing unit 29 to 36 by using first substrate transport units 13, 14, and then, substrate 7 in a wet-state after completing the liquid processing is transported to supercritical dry processing units 37 to 44 from carry-out port 76 which is formed separately from carry-in port 75 in each of liquid processing units 29 to 36 using second substrate transport units 49 to 52.

For that reason, in substrate processing apparatus 1, carry-in port 75 through which substrate 7 in a dry-state before the processing passes and carry-out port 76 through which substrate 7 in a wet-state after completing the processing passes may be clearly separated from each other in liquid processing units 29 to 36, and the processing liquid scattered or volatilized from substrate 7 may be prevented from being directly attached to carry-in port 75 or indirectly attached to first substrate transport units 13, 14 via carry-in port 75. As a result, in substrate processing apparatus 1, the processing liquid may be prevented from being transferred and attached to the substrate via first substrate transport units 13, 14, after the dry processing, and the contamination of the surface of substrate 7 may be prevented after the dry processing to improve the yield of substrate processing apparatus 1.

Specifically, in substrate processing apparatus 1, since substrate 7 after completing the liquid processing (before the dry processing) is in a wet-state by being coated with a high volatile organic solvent, there is a concern that the organic solvent is volatilized in the carry-out path from liquid processing units 29 to 36 to second substrate transport units 49 to 52. However, the carry-in path from first substrate transport units 13, 14 to liquid processing units 29 to 36 and the carry-out path from liquid processing units 29 to 36 to second substrate transport units 49 to 52 are clearly separated from each other, and thus, the diffusion of the contamination may be suppressed.

Further, in substrate processing apparatus 1, first substrate transport units 13, 14 are accommodated in first substrate transport chambers 11, 12, and second substrate transport units 49 to 52 are accommodated in second substrate transport chambers 45 to 48, respectively. For that reason, in substrate processing apparatus 1, the transport space (transport path) in which substrate 7 in a dry-state is transported using first substrate transport units 13, 14 and the transport space (transport path) in which substrate 7 in a wet-state is transported using second substrate transport units 49 to 52 are separately formed from each other, and the transfer and attachment of the processing liquid may be further prevented.

Further, in substrate processing apparatus 1, the dew point temperature of the gas supplied to second substrate transport chambers 45 to 48 is made to be lower than the dew point temperature of the gas supplied to first substrate transport chambers 11, 12. For that reason, in substrate processing apparatus 1, the dew condensation may be prevented from occurring in the inside of each of second substrate transport chambers 45 to 48 that transports substrate 7 in a wet-state.

Specifically, in substrate processing apparatus 1, since substrate 7 after the liquid processing (before the dry processing) is in a wet-state by being coated with an organic solvent having high absorptiveness, the anti-dry liquid may adsorb water during the transport to supercritical dry processing units 37 to 44 using second substrate transport units 49 to 52. As a result, substrate 7 or dry processing device 77 may be damaged when supercritical dry processing units 37 to 44 are in a high pressure state. However, the dew point temperature within second substrate transport chambers 45 to 48 is made to be low, and thus, the adsorption of the water by the anti-dry liquid may be suppressed. Further, a gas having a low dew point temperature may be supplied only to second substrate transport chambers 45 to 48, and thus, the consumption of expensive gas may be reduced to suppress the increase of the running cost.

Further, in substrate processing apparatus 1, first substrate transport units 13, 14 and second substrate transport units 49 to 52 are disposed in the opposite sides of each of liquid processing units 29 to 36 therebetween. Therefore, a gap of each of first substrate transport units 13, 14 (carry-in port 75) and each of second substrate transport units 49 to 52 (carry-out port 76) may be increased, and as a result, the transfer and attachment of the processing liquid may be further prevented.

Figure 8:
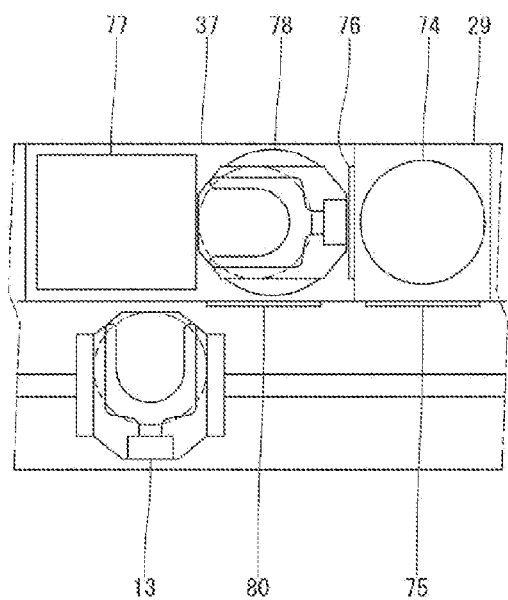
FIG. 8 is an enlarged plan view illustrating another substrate processing apparatus.

The displacement of first substrate transport units 13, 14 and second substrate transport units 49 to 52 is not limited thereto, but second substrate transport units 49 to 52 may be disposed between liquid processing units 29 to 36 and supercritical dry processing units 37 to 44. In that case, as illustrated in FIG. 8, carry-out port 76 of any one of liquid processing units 29 to 36 is formed between liquid processing units 29 to 36 and any one of supercritical dry processing units 37 to 44 making carry-out port 76 to serve as the carry-in port as well, and carry-in/carry-out mechanism 78 of any one of supercritical dry processing units 37 to 44 is installed to be capable of being rotated, advanced and retreated. Then, substrate 7 may be transported from any one of liquid processing units 29 to 36 to any one of supercritical dry processing units 37 to 44 using carry-in/carry-out mechanism 78 as the second substrate transport unit. Accordingly, substrate processing apparatus 1 may be formed in a compact size.

Figure 9:
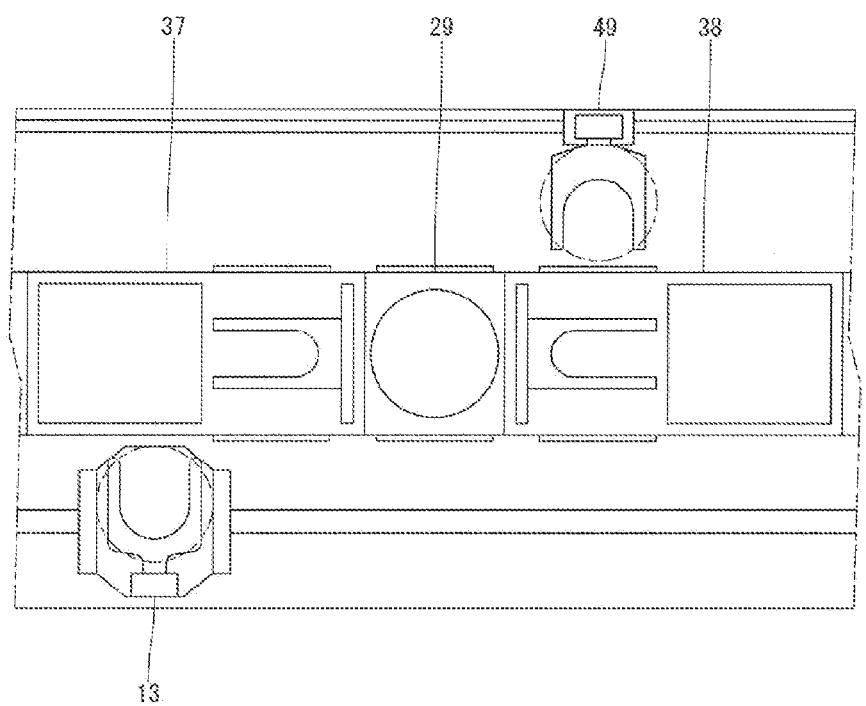
FIG. 9 is an enlarged plan view illustrating yet another substrate processing apparatus.

Further, the arrangement of liquid processing units 29 to 36 and supercritical dry processing units 37 to 44 is not limited to the above-described arrangement. For example, as illustrated in FIG. 9, a single liquid processing unit 29 may be disposed between two supercritical dry processing units 37, 38, and substrate liquid-processed in liquid processing unit 29 may be dried in any one of supercritical dry processing units 37, 38.

In the present disclosure, substrate processing apparatus 1 may includes: liquid processing units 29 to 36 of which carry-in port 75 and carry-out port 76 are formed separately from each other; supercritical dry processing units 37 to 44; first substrate transport units 37 to 44 that transport substrate 7 in a dry-state before the liquid processing; and second substrate transport units 49 to 52 that transport substrate 7 in a wet-state after the liquid processing to supercritical dry processing units 37 to 44 from carry-out port 76 of liquid processing units 29 to 36. Accordingly, the arrangement or the shapes of liquid processing units 29 to 36, supercritical dry processing units 37 to 44, first substrate transport units 13, 14 or second substrate transport units 49 to 52 may be set appropriately.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate processing apparatus comprising:
   a liquid processing unit configured to process a substrate with a processing liquid;
   a carry-in port formed in the liquid processing unit, wherein the carry-in port is configured such that the substrate can be carried through the carry-in port in a dry-state before the substrate is processed with the processing liquid;
   a carry-out port formed in the liquid processing unit, wherein the carry-out port is configured such that the substrate can be carried out through the carry-out port in a wet-state after the substrate is processed with the processing liquid;

a supercritical dry processing unit configured to perform a dry processing for the substrate using a supercritical fluid;

a first substrate transport unit configured to transport the substrate in a dry-state to the carry-in port of the liquid processing unit before the substrate is processed with the processing liquid, wherein the first substrate transport unit is configured to move through a first substrate transport chamber; and a second substrate transport unit configured to transport the substrate in a wet-state from the carry-out port of the liquid processing unit to the supercritical dry processing unit, wherein the second substrate transport unit is configured to move through a second substrate transport chamber that is separate from the first substrate transport chamber;

wherein the first substrate transport unit is configured to transport the substrate from a carry-out port of the supercritical dry processing unit after the substrate has been dried in the supercritical dry processing unit, wherein the first substrate transport unit is not configured to move through the second substrate transport chamber, and wherein the second substrate transport unit is not configured to move through the first substrate transport chamber.

2. The substrate processing apparatus of claim 1, wherein the second substrate transport unit transports the substrate in a state where the substrate is wetted by an organic solvent.

3. The substrate processing apparatus of claim 1, wherein the carry-in port and the first substrate transport chamber are communicated with each other, and the carry-out port of the liquid processing unit and the second substrate transport chamber are communicated with each other.

4. The substrate processing apparatus of claim 1, wherein a door which is capable of being opened/closed is installed in the liquid processing unit's carry-in port and/or the liquid processing unit's carry-out port.

5. The substrate processing apparatus of claim 1, wherein the dew point temperature of a gas supplied to the second substrate transport chamber is lower than the dew point temperature of a gas supplied to the first substrate transport chamber.

6. The substrate processing apparatus of claim 1, wherein the dried substrate is carried out from the supercritical dry processing unit by the first substrate transport unit.

7. The substrate processing apparatus of claim 1, wherein the first substrate transport unit and the second substrate transport unit are disposed on opposite sides of the liquid processing unit.

8. A substrate processing method comprising:

transporting a substrate in a dry-state before the substrate is going through a liquid processing to a carry-in port formed in a liquid processing unit using a first substrate transport unit, wherein the first substrate transport unit is configured to move through a first substrate transport chamber;

liquid-processing the substrate with a processing liquid in the liquid processing unit;

transporting the substrate in a wet-state after completing the liquid-processing from a carry-out port, which is formed separately from the carry-in port, formed in the liquid processing unit to a supercritical dry processing unit using a second substrate transport unit, wherein the second substrate transport unit is configured to move through a second substrate transport chamber that is separate from the first substrate transport chamber so as to prevent liquid in the second substrate transport chamber from contaminating the first substrate transport chamber, wherein the first substrate transport unit is not configured to move through the second substrate transport chamber, and wherein the second substrate transport unit is not configured to move through the first substrate transport chamber;

processing the substrate with a supercritical fluid using the supercritical dry processing unit; and transporting the substrate in a dry-state from the a carry-out port of the supercritical dry processing unit using the first transport unit.

9. The substrate processing method of claim 8, further comprising transporting the substrate in a state where the substrate is wetted by an organic solvent using the second substrate transport unit.

10. The substrate processing method of claim 9, further comprising supplying a gas having a dew point temperature to the second substrate transport chamber, the dew point temperature being lower than that of a gas supplied to the first substrate transport chamber.

* * * * *